United States Patent [19] [11] Patent Number: 5,093,612
Herold [45] Date of Patent: Mar. 3, 1992

[54] SECONDARY VOLTAGE SUPPLY AND VOLTAGE CLAMPING CIRCUIT

[75] Inventor: Barry W. Herold, Boca Raton, Fla.

[73] Assignee: Motorola, Inc., Schaumburg, Ill.

[21] Appl. No.: 548,478

[22] Filed: Jul. 5, 1990

[51] Int. Cl.⁵ .............................................. G05F 1/56
[52] U.S. Cl. ................................. 323/222; 323/282; 323/267
[58] Field of Search ................ 323/222, 282, 231, 267

[56] References Cited

U.S. PATENT DOCUMENTS

| 4,609,863 | 9/1986 | Asai et al. | 323/231 |
| 4,639,551 | 1/1987 | Kaire | 323/231 |
| 4,644,251 | 2/1987 | Rathke | 323/267 |
| 4,673,865 | 6/1987 | DeLuca et al. | 323/267 |

OTHER PUBLICATIONS

Feebeck et al., "Dual-Voltage, Opposite-Tracking Regulator", IBM Technical Disclosure Bulletin, vol. 14, No. 9, Feb. 1972, p. 2636.

Primary Examiner—Peter S. Wong
Attorney, Agent, or Firm—Thomas G. Berry; Vincent B. Ingrassia

[57] ABSTRACT

A circuit (200) for generating a first (EL1) and second (EL2) drive signals and limiting a maximum voltage of each of the drive signals (EL1, EL2). The circuit (200) further samples the drive signals (EL1, EL2) to provide a voltage source (Vdd).

4 Claims, 2 Drawing Sheets

SECONDARY VOLTAGE SUPPLY AND VOLTAGE CLAMPING CIRCUIT

FIELD OF THE INVENTION

This invention relates in general to voltage generation, and more specifically to a generation of a secondary supply voltage.

BACKGROUND OF THE INVENTION

Information display illumination for direct or backlighting purposes is well known to those skilled in the art. Conventional information display devices such as a liquid crystal display require the presence of a light source in order to provide contrast which makes the display readable. When in high ambient lighting conditions such as sunlight, the liquid crystal display requires no additional illumination source in order to provide sufficient contrast.

However, in low ambient lighting conditions, display illumination is accomplished in conventional information display devices by the use of incandescent bulbs or electro-luminescent display panels. Incandescent bulbs, when used as a means for display backlighting, yield significant undesirable bright spots in the areas of the display near their physical locations. Many attempts have been made to uniformly diffuse the light emitted from incandescent sources to provide a more consistent illumination of the information display area. The present trend in electronic information display devices is to use electro-luminescent display panels as backlighting devices. When used as a backlighting illumination device, the electro-luminescent display panel solves the problems of bright spots associated with the use of incandescent bulbs as backlighting devices. With electro-luminescent display panels, designers now have an excellent means of providing a uniform illumination for backlighting a liquid crystal display when viewed in low ambient lighting conditions.

However, electro-luminescent display panels are not without their problems. The most significant problem facing the design engineer after selecting the electro-luminescent display panel for illumination of an information display is the high drive voltage required to effectively illuminate an electro-luminescent display panel. The higher (or medium) voltage requirements of EL panel results in extra circuitry to generate the higher voltage from the conventional low voltage supply of selective call receivers. Typically, the present art generates another high voltage supply by using a second booster converter, which may be generated by additional circuitry.

FIG. 1 shows a block diagram of a conventional drive circuit for a electroluminescent (EL) panel 110. According to this configuration, an input clock within the timing logic 112 provides the necessary timing for the operation of the EL panel drive 114. During one phase of the panel drive 114, the EL1 side of the EL panel 110 is coupled to ground, and the EL2 side is coupled to the coil 108 through the internal diode 102. By rapidly opening and closing the coil switch 118 within the coil drive 116, the EL panel 110 is charged to its operating voltage (typically seventy volts). When the EL panel 110 reaches its operating voltage the phase of the EL lines (EL1, EL2) are reversed, thus connecting the EL2 side of the EL panel 110 to ground, and connecting the EL1 side to the coil 108 through the internal diode 102. Similar switching operation of the coil switch 118 charges the EL panel 110 to its operating voltage as described above.

As further shown, the EL panel 110 and the timing logic 112 are conventionally supplied from a single power supply (B+) from which the high voltage for powering the EL panels is generated. However, the power supply (B+) would not provide an economical solution for many contemporary small devices, such as, selective call receivers, because a high voltage supply would severely increase the cost of the device.

Alternative methods for generating a high voltage from a low voltage battery includes the known techniques of voltage multiplication. However, the power supply of small devices (e.g., selective call receiver) is about one and half volts, which is insufficient to generate the timing logic 112. Therefore, a large and more expensive power supply (B+) capable of providing a higher voltage and current is used, thus failing to provide a cost effective solution for various voltage supplies. Accordingly, a need exists for a cost-effective method of generating secondary voltages power supplies to permit the use of lower voltage.

SUMMARY OF THE INVENTION

Briefly, according to the invention, a circuit for generating a first and second drive signals includes a limiter for limiting a maximum voltage of the drive signals. The circuit further samples the drive signals to provide a secondary voltage source.

DESCRIPTION OF A PREFERRED EMBODIMENT

Figure 1:
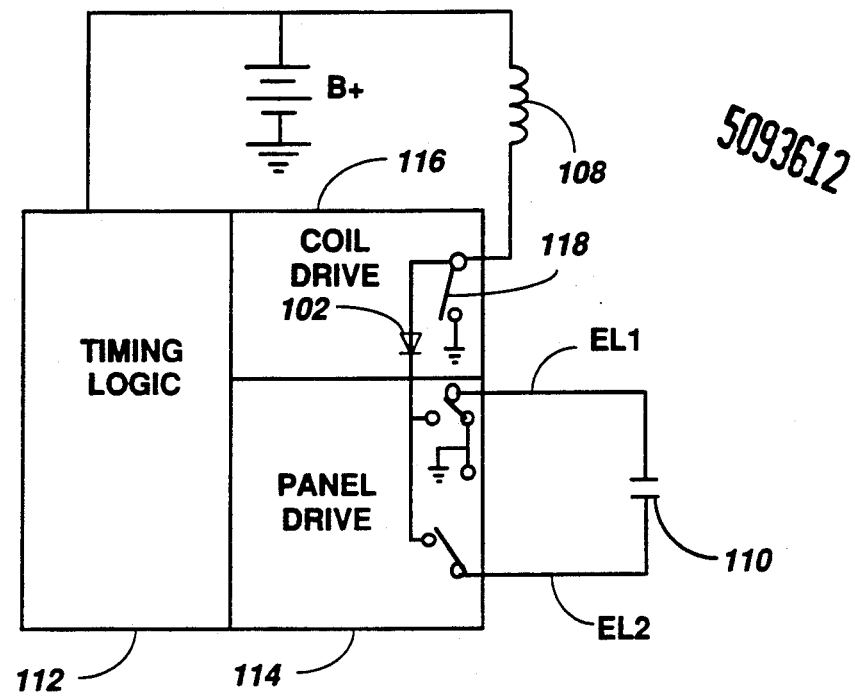
FIG. 1 is a block diagram of a conventional EL panel drive method using a primary power supply.
Figure 2:
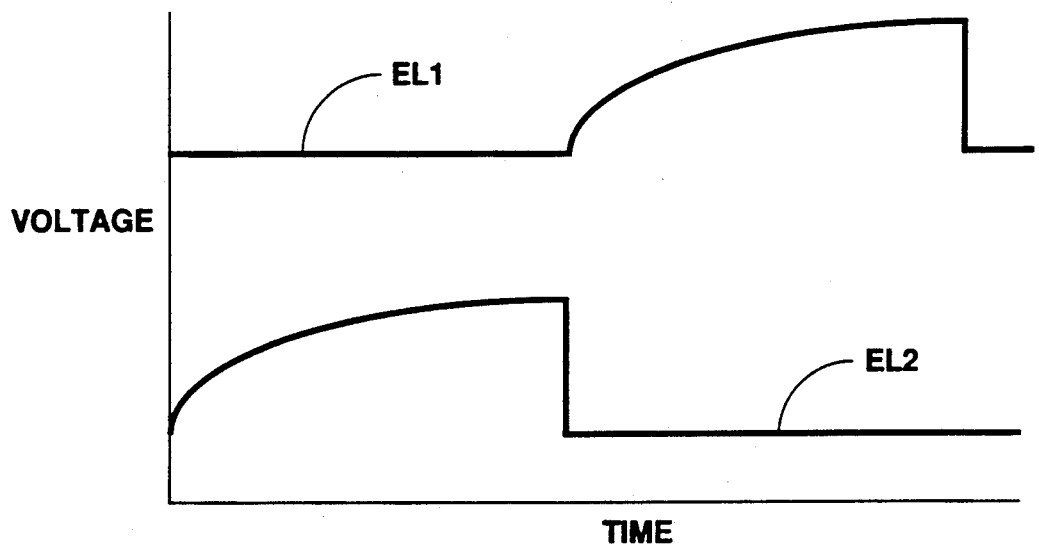
FIG. 2 is an illustration of FIG. 1 and FIG. 3 the phase reference of signals applied to the electro-luminescent panel.
Figure 3:
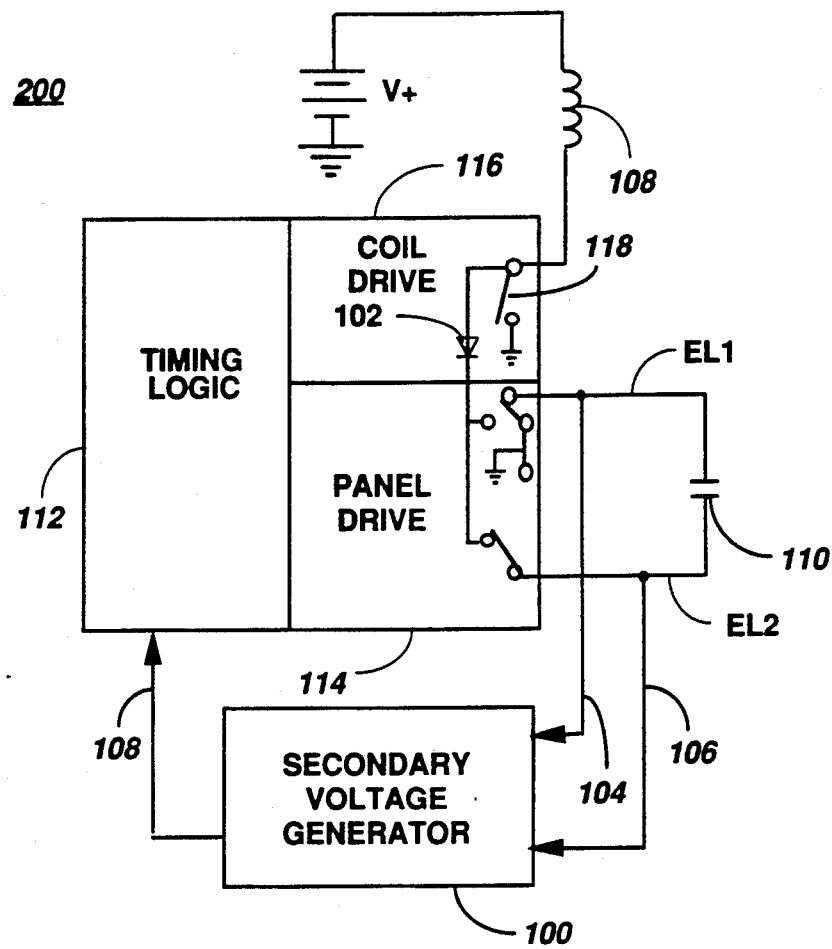
FIG. 3 is a block diagram of an EL panel driver and secondary voltage generator in accordance with the present invention.

According to the invention, FIG. 3 shows a block diagram of an embodiment for generating a secondary voltage supply for supplying additional circuits, such as, MOS timing circuits 112. The EL drive signals (shown in FIG. 2) are generated from a low voltage power supply (preferably, one-and-half-volts supply in a selective call receiver) by "pulsing" a coil 108 with the power supply (V+). The "pulsing" or switching technique causes a high voltage to develop across the coil 108, which is used to power the corresponding EL terminals 104, 106. Those skilled in the art will appreciate that an EL panel 110 requires a high voltage supply EL1, EL2 during normal operation.

Operationally, the coil 108 and coil drive 116 generates a high voltage supply EL1, EL2 which are applied to the panel drive 114 and the EL panel 110. FIG. 2 shows the phase relationship of the signals EL1, EL2 that are applied to the EL panel 110. According to the invention, the signals EL1, EL2 may be used to generate a secondary voltage supply by coupling to input lines 104, 106. That is, the EL1, EL2 lines of the EL panel 110 are coupled to a secondary voltage generator 100 that is used to generate a secondary voltage on line 108. The voltage is preferably used to power other circuits (e.g., MOS timing logics etc.). In this way, a secondary voltage is generated from the supply (EL1, EL2) to the EL panel 110 that is able to power external circuits without requiring additional circuitry, thus providing a more economical solution for generating an additional high voltage demand.

Figure 4:
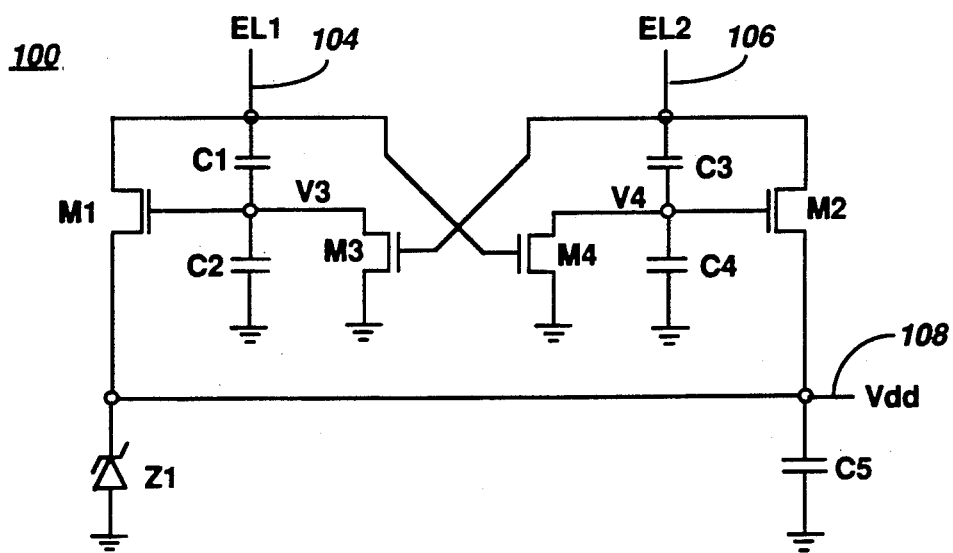
FIG. 4 is a schematic diagram of the secondary voltage generator shown in FIG. 3.

FIG. 4 is a schematic diagram illustrating the details of the present invention. According to the invention, an additional supply voltage is generated that additionally provides an over-voltage protection for the signals applied to input lines 104, 106. Operationally, during one phase of the EL panel supply (EL1), the input 104 is connected to ground and the other input 106 is coupled to the supply EL2 (shown in FIG. 2) as previously discussed. When the input 106 reaches a known threshold voltage of a transistor M3, the drain voltage V3 is reduced to zero volts. Further gains in the supply voltage 106 increases the voltage V4, which is controlled by the ratio of capacitors C3 and C4 by the well known techniques of capacitance voltage dividing. The voltage V4 is given as:

$$V4 = EL2 \cdot C3/(C3+C4)$$

where EL2 is the voltage applied on the input 106.

When the voltage V4 increases to a pre-determined threshold above Vdd on the output 108, the transistor M2 turns on and begins conducting. The voltage Vdd follows the voltage V4, thus charging the capacitor C5 to the voltage Vdd. The voltage Vdd thus corresponds to the zener diode breakdown voltage. At this point, any excess current into the input 106 is routed to ground through the transistor M2 and the zener diode Z1. The effect of routing the excess current to ground produces an upper limit to the voltage applied at the input 106. The maximum or limiting voltage is given as:

$$EL2max = (Vz + Vt) \cdot (C3+C4)/C3$$

where,

Vz is the zener breakdown voltage,

Vt is the threshold voltage of M2, and

Capacitors C3, C4 are the capacitance of the voltage divider.

During the next phase (EL2), the input 106 is connected to ground, and the input 104 is coupled to the signal EL1 (shown in FIG. 2). Similarly, the EL1 input is used to alternately generate the output voltage Vdd using the capacitors C1 and C2 and transistors M1 and M4. The corresponding equations are given as:

$$V3 = EL1 \cdot C1/(C1+C2);$$

and $$EL1max = (Vz+Vt) \cdot (C1+C2)/C1.$$

The feedback devices (e.g., transistor) M3 and M4 are used to initialize the capacitive dividers to zero voltages and further compensates for leakages the may occur within the circuits.

In this way, the secondary voltage generated avoids complex circuitry, which is used, for example, in the case of voltage multiplication circuits. Accordingly, external circuitry (i.e., MOS timing logic) requiring a higher voltage than the typical one-and-half volts supply of a selective call receivers can be satisfied more economically. In this way, the invention uses the high voltage supply (EL1, EL2) of the EL panel to generate a secondary supply that is used to supply other circuits (e.g., the MOS timing circuits). In small devices, such as selective call receivers, this technique reduces the cost-burden to the users to these devices.

In summary, the invention includes a circuit for generating a first and second drive signals including a limiter for limiting a maximum voltage of each of the drive signals. The circuit further samples the drive signals to provide a secondary voltage source. The secondary voltage source may be used to power other external or internal circuits (e.g., MOS counters etc.) without placing any undue demand on the power supply (e.g., the one and half volt supply for a selective call receiver). This invention, thus, provides an appreciable cost benefit to the selective call receiver users.

I claim:

1. A circuit, comprising:
   means for generating a first and second drive signals;
   means for limiting a maximum voltage of each of the drive signals;
   means for sampling the drive signals to provide a voltage source.

2. The circuit according to claim 1 wherein the first and second drive signals comprise periodic signals.

3. The circuit according to claim 1 wherein the limiting means comprises a capacitive divider and a zener diode coupled with a transistor that route excess current to ground.

4. A method for generating a secondary voltage supply, comprising the steps of:
   (a) generating a first and a second drive signals;
   (b) limiting a maximum voltage of the drive signals;
   (c) sampling the drive signals to provide a secondary voltage source.

* * * * *